(12) United States Patent
Mitsuda

(10) Patent No.: US 6,396,281 B1
(45) Date of Patent: May 28, 2002

(54) WORK BENCH FOR HOLDING ELECTRIC WIRES AND SYSTEM FOR PRODUCING WIRE HARNESS SUBASSEMBLY

(75) Inventor: Kohei Mitsuda, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 4 days.

(21) Appl. No.: 09/593,418

(22) Filed: Jun. 14, 2000

(30) Foreign Application Priority Data

Jun. 16, 1999 (JP) .......................................... 11-169705

(51) Int. Cl.$^7$ ............................................... G01R 31/00
(52) U.S. Cl. ....................................... 324/503; 324/500
(58) Field of Search ................................ 324/503, 500, 324/510, 511, 512, 513, 522, 539; 248/121, 122.1, 127; 254/134.3 R

(56) References Cited

U.S. PATENT DOCUMENTS

| | | | |
|---|---|---|---|
| 4,488,497 A | * 12/1984 | Bevans ........................ | 108/144 |
| 4,728,065 A | * 3/1988 | Coote ......................... | 248/129 |
| 5,016,345 A | * 5/1991 | Aligue et al. ................ | 29/742 |
| 5,079,827 A | * 1/1992 | Meyer ........................ | 29/566.3 |
| 5,095,277 A | * 3/1992 | Cerda ......................... | 324/539 |
| 5,374,019 A | * 12/1994 | Fischer ....................... | 248/122 |
| 5,535,788 A | * 7/1996 | Mori et al. ................. | 140/92.1 |
| 5,645,265 A | * 7/1997 | Shu .......................... | 254/134.3 |
| 5,930,892 A | * 8/1999 | Kato et al. .................. | 29/861 |
| 6,141,867 A | * 11/2000 | Fukada et al. ............... | 29/747 |
| 6,220,874 B1 | * 4/2001 | Kurata et al. ............... | 439/76.2 |

FOREIGN PATENT DOCUMENTS

JP          9198939          7/1997

OTHER PUBLICATIONS

An English Language abstract of JP 9–198939.

* cited by examiner

Primary Examiner—Safet Metjahic
Assistant Examiner—T. R. Sundaram
(74) Attorney, Agent, or Firm—Greenblum & Bernstein, P.L.C.

(57) ABSTRACT

The present invention provides a work bench for holding electric wires. The work bench includes a generally vertical pillar and a head provided on the top of the pillar. The head includes a body having an upper surface on which electric wires may be hung. A stopper is provided at a front end of the body so as to prevent the electric wires from falling from the body and to enable the electric wire to be pulled out from the body along the stopper. A swingable member is provided on the body so that at least a portion of each electric wire is held between the body and the swingable member. The work bench can prevent the electric wire falling off the body and can store many kinds of electric wires in a compact way that improves work and space efficiency.

27 Claims, 6 Drawing Sheets

WORK BENCH FOR HOLDING ELECTRIC WIRES AND SYSTEM FOR PRODUCING WIRE HARNESS SUBASSEMBLY

BACKGROUND OF THE INVENTION

1. Field of Invention

The present invention relates to a work bench that is used when electric wires are temporarily bound during manufacturing wire harnesses.

2. Description of Related Art

Generally, when a wire harness that connects electric components of an automobile is manufactured, first, a temporary binding circuit is produced from a relatively small number of electric wires, and then, a final binding circuit is produced by combining plural temporary binding circuits.

FIG. 7 shows a temporary binding work bench that is conventionally used when a temporary binding circuit is produced. This work bench has plural channels 50 arranged in parallel, and a guide bar 51 provided at the rear side of the channels. The work bench further has a continuity tester 53 on a table provided at the front side of the channels 50.

When a temporary binding circuit is produced by using the work bench as shown in FIG. 7, each type of electric wires A is placed in one of the channels 50. The rear end of long electric wires A hang over the guide bar 51. One of the electric wires A is pulled out from the channel and a terminal t of the electric wire is inserted into a connecter. Then, continuity is checked by using the continuity tester 53.

However, the work bench described above has the following problems. First, when one of the electric wires A is being pulled out from the channel 50, the electric wire is interfered with by other electric wires. For example, the terminals t of electric wires may be hooked with each other. Thus, electric wires A other than the electric wire being pulled out also gradually proceed forwardly, and become irregularly arranged. Accordingly, the operation of temporary binding becomes difficult.

Second, the work bench occupies a large space. In particular, when the electric wires are long, the guide bars 51 must be extended rearwardly. Thus, the space efficiency becomes worse.

Accordingly, an object of the present invention is to provide a work bench for temporary binding that can store many types of electric wires in a compact way and improve work and space efficiency.

SUMMARY OF THE INVENTION

To achieve the above and/or other goals, the present invention provides a work bench for temporary binding electric wires that has a generally vertical pillar and a head provided on the pillar. The head includes a body having an upper surface on which electric wires may be hung. A stopper is provided at the front end of the body to prevent the electric wires from falling from the front end of the body. Each electric wire can be pulled out from the body along the stopper. A swingable member is provided on the body so that at least a portion of each electric wire is held between the body and the swingable member.

In accordance with the features of the work bench of the present invention, the electric wires hanging on the body contact each other only at a small portion along the top of the body. In addition, the electric wire is pulled obliquely downwardly for removal, instead of pulling out in the longitudinal direction of the electric wires. Thus, electric wires, other than the one that is being pulled out, do not come out together with the required one. Further, when electric wires become entangled in the electric wire to be pulled out and tend to escape from the body, the swingable member presses against the electric wires to prevent them from escaping.

The swingable member can be pivotally mounted at the rear end of the body for upward pivoting and extend toward the front end of the body and engages the electric wires hung on the body.

In another aspect of the present invention, a pushing member is provided under the body. The pushing member pushes inwardly on one end of each electric wires that hang down from the body. Accordingly, even if weights of the electric wires hanging from the opposite sides of the body are unbalanced, the pushing member prevents the electric wires from falling off the body.

In further aspect of the present invention, the swingable member includes a pivoting board, a resilient strip, a cover board. The pivoting board is fixed to the rear end of the body by a hinge and extends toward the front end. The resilient strip is adhered on the lower surface of the pivoting board and projects forwardly past the front end of the pivoting board. The cover board is fixed to the pivoting board at the front end of the pivoting board by a hinge and extends forwardly. The front end of the cover board abuts the stopper. A weight can also be provided on the front end of the cover board.

According to this construction of the present invention, the resilient strip presses against the electric wires that become entangled in the electric wire required being pulled out. In addition, even if the resilient strip fails to prevent the electric wires from escaping from the body, the cover board flips the electric wires and returns them to the body.

In further aspect of the present invention, the pushing member includes a base board and a non-slip member secured to the base board. According to the features of the present invention, since friction occurs between the non-slip member and the electric wires, the electric wires are prevented from falling off the body.

In another aspect of the present invention, the pushing member is supported to be vertically movable and rotatable. Accordingly, the distance between the pushing member and the body can be adjusted. The angle of the pushing member with respect to the body can also be adjusted. The distance and the angle are adjusted according to the thickness of the electric wires so that the electric wire are not overburdened.

Moreover, the present invention provides a system for temporary binding of electric wires. The system has a frame, a plurality of generally pillars mounted on the frame, a plurality of heads configured to hang electric wires. Each of the heads is provided on one of the pillars. The system also has a table provided adjacent to the frame, and a continuity tester provided on the table. In accordance with this construction, when each type of electric wires are positioned on one of the heads, an operator can withdraw one electric wire from each head, and connect to the continuity tester to check the continuity of the electric wires. Preferably, the frame has a U-shape and is mounted on casters, and the table is provided inside the U-shape.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

Figure 1:
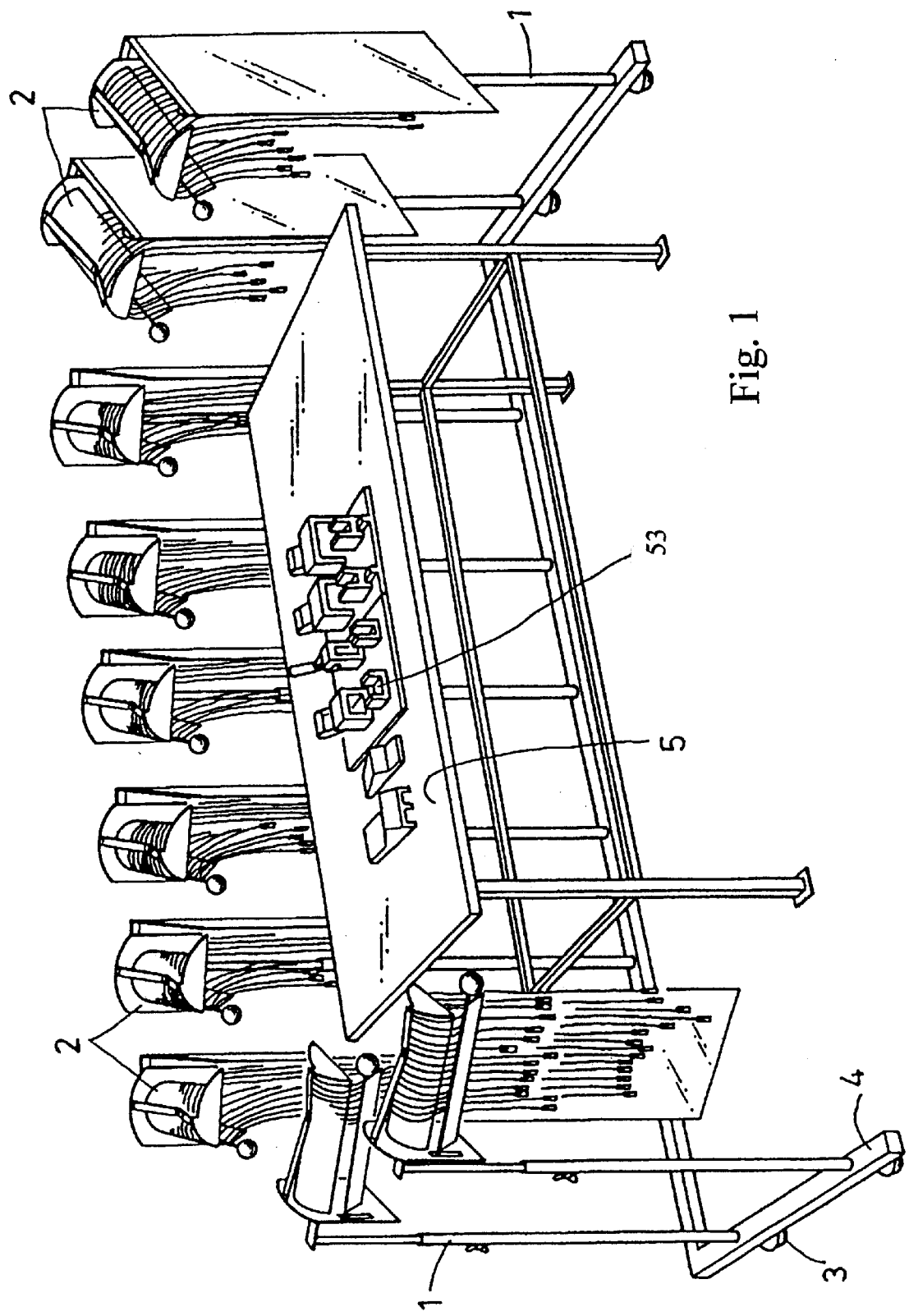
FIG. 1 is a perspective view of a total arrangement of a work bench for temporary binding according to an embodiment of the present invention.

FIG. 1 shows an example of an arrangement of a work bench during a working operation according to an aspect of the present invention. As shown in FIG. 1, the work bench has a plurality of pillars 1 arranged in a U-shape as viewed from above. Each pillar 1 has a head 2 and the pillars 1 are mounted on a frame 4 having casters 3. A table 5 is provided inside of the frame 4 and the conventional continuity tester 53 is provided on the table 5.

Figure 2:
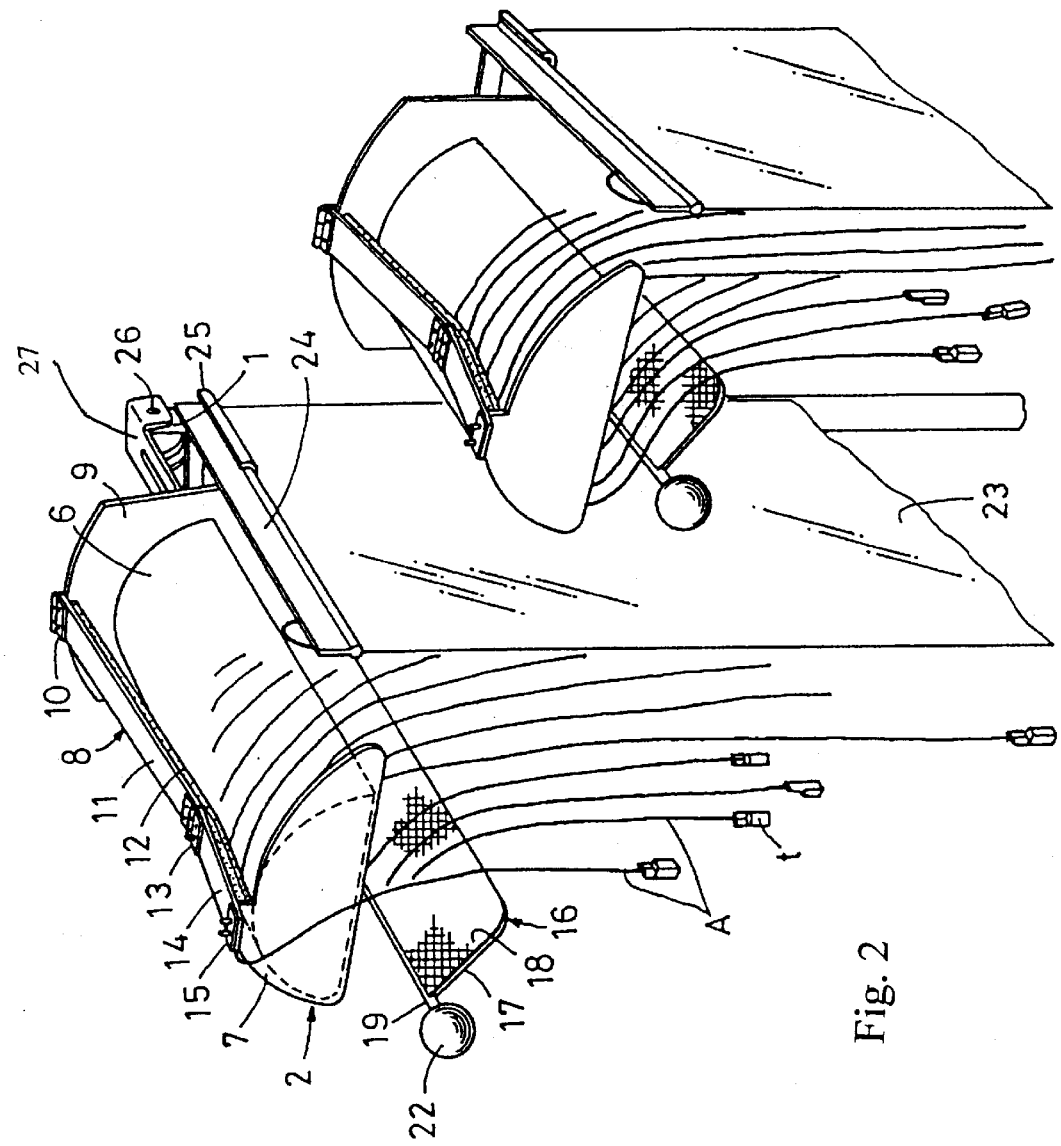
FIG. 2 is a perspective view of a pair of work benches shown in FIG. 1.

As shown in FIGS. 2 though 5, the head 2 includes a body 6, which has a generally semi-cylindrical shape placed so that the curved peripheral surface of the semi-cylindrical shape faces upwardly, and a flange 7 is provided at the front end of the body 6. Electric wires A are hung on the body 6. The flange 7 radially projects from the curved peripheral surface of the body 6. Thus, the flange 7 is a stopper to prevent the electric wire A falling from the front end of the body 6. The amount of the projection becomes increasingly larger from one end 7A of the curved peripheral surface to the top 7B. At the top, a step 7C is provided so that the amount of the projection is reduced. After the step 7C, the amount of the projection becomes larger again toward another end 7D of the curved peripheral surface. As described later, an operator can pull out one of the electric wires A along the flange.

Figure 3:
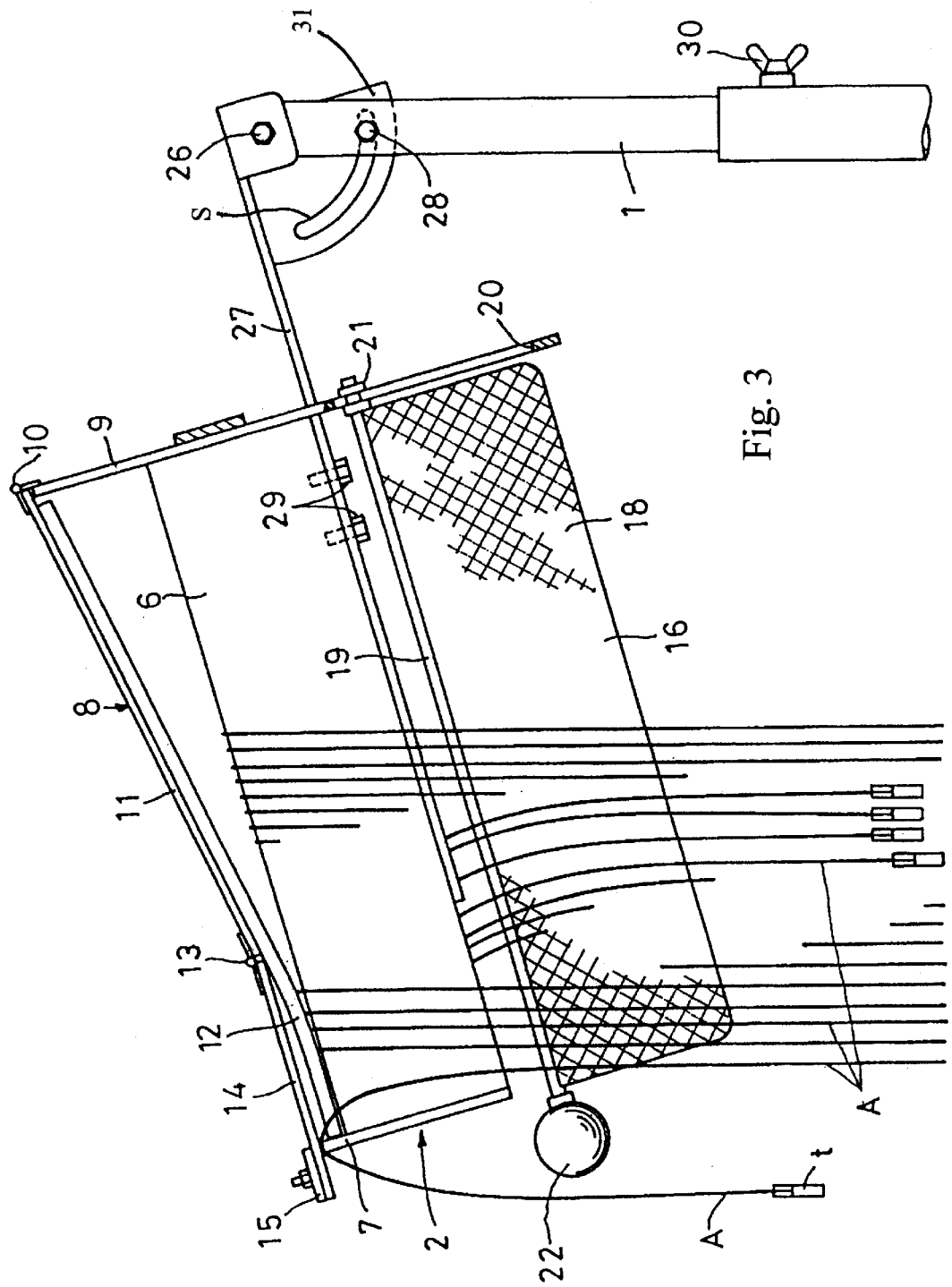
FIG. 3 is a side elevation view of the head of the work bench shown in FIG. 1.

A swingable member 8 is provided above the body 6. The swingable member 8 pivots vertically with respect to the rear end of the body 6 as a fulcrum (pivot). The swingable member 8 includes a pivoting board 11 that is pivotably attached to a rear board 9 of the body 6 by a hinge 10, and extends toward the front end of the body 6. A resilient strip 12 made of any suitable resilient material, for example oil proof rubber, is attached to the lower surface of the pivoting board 11, for example, by use of a suitable adhesive. The resilient strip 12 extends past the front end of the pivoting board 11 to abut the flange 7. Toward the front end of the body 6, the resilient strip 12 is curved to engage along the top surface of the body 6 as seen in FIG. 3. A cover board 14 is connected to the front end of the pivoting board 11 by a hinge 13, and extends toward the front side. The front end of the cover board 14 abuts the flange 7, and the cover board 14 has a weight 15 on the front end.

Figure 4:
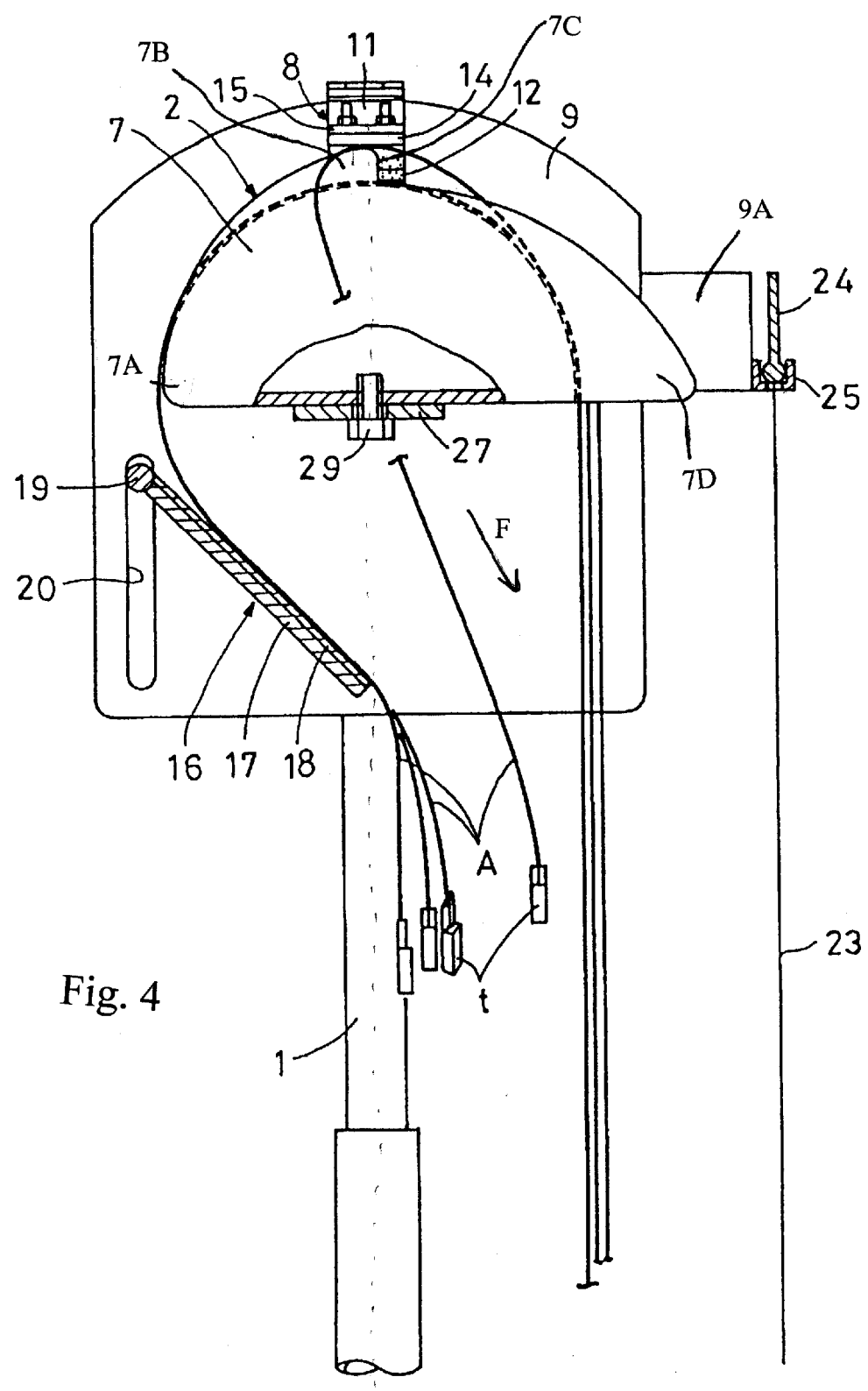
FIG. 4 is a front elevation view of the work bench shown in FIG. 1.

A rear board 9 is provided at the rear end of the body 6. The rear board 9 extends in a plane substantially perpendicular to the central axis of the semi-cylindrical shape of the body 6. As shown in FIG. 4, the rear board extends downwardly past the body 6.

A pushing member 16 is provided under the body 6 at one side of a vertical plane including the central axis of the semi-cylindrical shape. The pushing member 16 includes a base 17 and a non-slip member 18, which may be textured, and is attached to the base 17, for example, by adhesive. A shaft 19 provided along the upper edge of the base 17 passes through a vertically elongated opening 20 that is provided in the rear board 9. The pushing member 16 can be moved vertically along the elongated opening 20. The pushing member 16 is also rotatable around the shaft 19. Thus, the angle of the pushing member 16 with respect to the body 6 is adjustable. A projecting portion of the shaft, which projects from the rear board 9 rearwardly, is fastened with a nut 21 so that the pushing member 16 maintains a predetermined distance from and a predetermined angle with respect to the body 6. A ball 22 is attached to the front end of the shaft 19.

Figure 5:
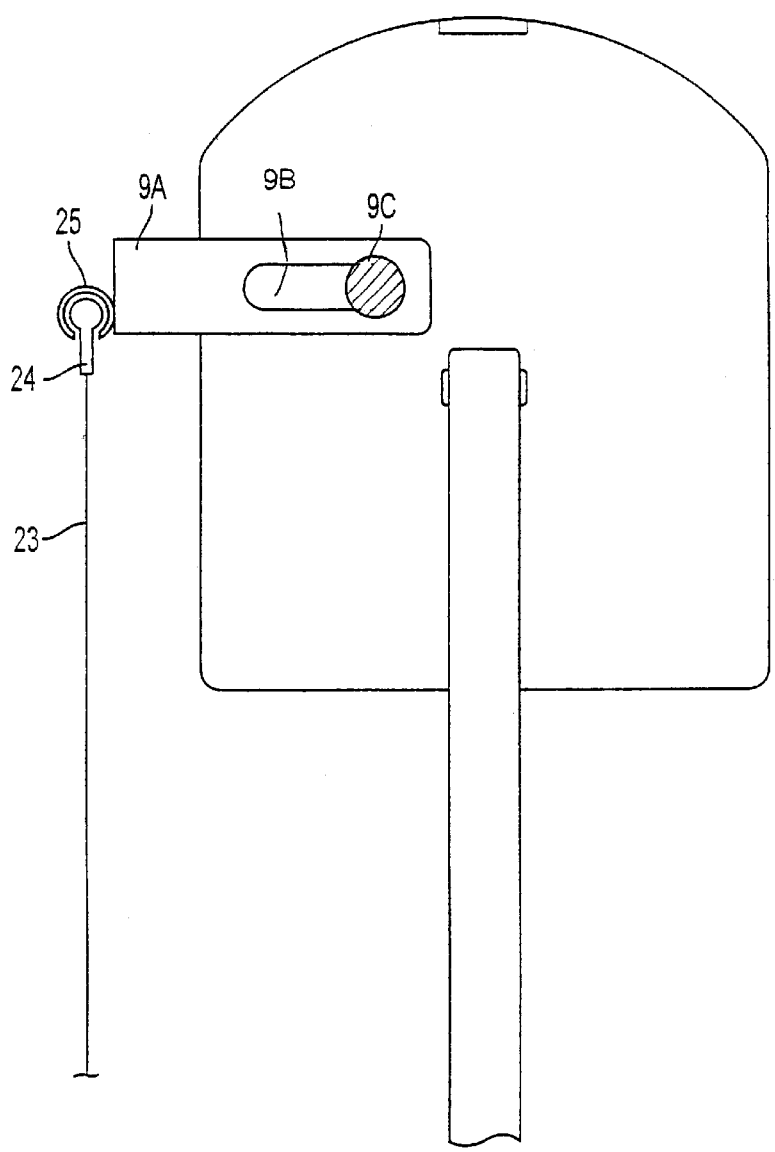
FIG. 5 is a rear elevation view of the work bench shown in FIG. 1.

A dividing sheet 23 is hung on the opposite side of the body 6 from the pushing member 16. The dividing sheet 23 may be made of any suitable material, for example, transparent vinyl. An upper frame 24 of the dividing sheet 23 is mounted on a guide rail 25, which is attached to a slide board 9A of the rear board 9 and extends in an axial direction of the semi-cylindrical shape of the body 6. The dividing sheet 23 is attached in any conventional manner to a flange portion 24B of the upper frame 24, for example, by adhesive, rivets, or threaded fasteners. The sheet 23 may be secured to one side of the flange portion 24B. Alternatively, the flange portion 24B may be formed from a pair of parallel flange portions, with an upper margin of the sheet being sandwiched therebetween. As shown in FIG. 5, the slide board 9A has a horizontally elongated opening 9B and is fastened to the rear board 9A by using a bolt 9C. Thus, the slide board 9A is horizontally slidably mounted to the rear board 9. According to the horizontal movement of the slide board 9A, the guide rail 25 can be moved horizontally toward and away from the body 6 so that the distance between the guide rail 25 and the body 6 can be adjusted. FIG. 5 provides another example of the upper frame 24 of the dividing sheet and the guide rail 25.

Figure 6:
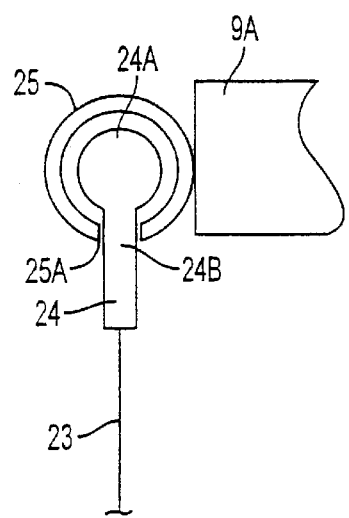
FIG. 6 is an enlarged view illustrating an engagement of a guide rail and an upper frame of a dividing sheet.
Figure 7:
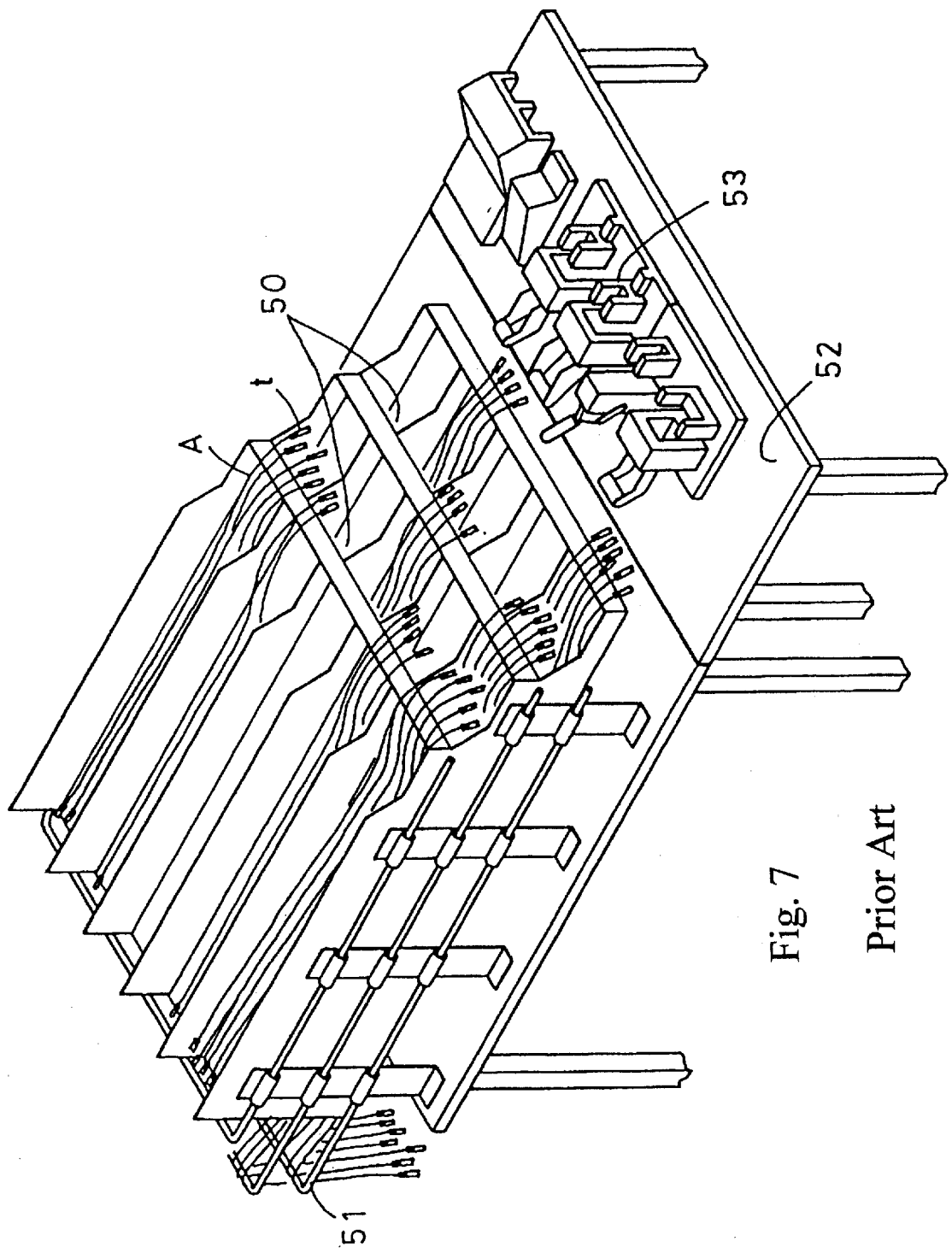
FIG. 7 is a perspective view illustrating a conventional work bench for temporary binding.

FIG. 6 is an enlarged view illustrating the engagement of the guide rail 25 and the upper frame 24 of the dividing sheet 23. The guide rail 25 is formed to have a generally tubular shape, with open ends and a slot 25A extending the length of the guide rail 25. An enlarged portion 24A of the upper frame 24 is held inside the guide rail with the flange portion 24B extending through the slot 25A. According to the construction of FIG. 6, the dividing sheet 23 is slidable fore and aft in an axial direction of the semi-cylindrical shape of the body 6.

A bracket 27 is attached to the pillar 1 at the rear end and extends toward the front to be vertically pivotable with respect to the pivot 26. The head 2 is connected to the pillar 1 via the bracket 27. The head 2 is slidable in the front-rear direction along the bracket 27. The bracket 27 is fastened to the pillar 1 by a bolt 28 that engages an arcuate slot S in a plate 31 so as to maintain a predetermined angle of the head with respect to the pillar. Thus, the angle of the bracket 27 is adjustable. The head 2 is fastened to the bracket 27 by bolts 29 so as to maintain a predetermined position in the longitudinal direction of the bracket 27. The pillar 1 is configured to be extensible and is fastened by a bolt 30 to fix the height of the head 2. The pillar 1 is also rotatable around the vertical axis. Thus, the horizontal direction of the head can be adjusted and is fixed by the bolt 30.

The operation of manufacturing a temporary binding circuit using the work bench described above is explained as follows. First, at each head 2, the dividing sheet 23 is slid rearwardly and the swingable member 8 is moved upwardly.

Then, each type of electric wires A is hung on the body 6. Thereafter, the swingable member 8 and the dividing sheet 23 are returned to the original positions.

At this time, the inclined angle, the position in the longitudinal direction along the bracket 27, the height and the horizontal direction of the head 2 can be adjusted by loosening the bolts 28, 29 and 30 in accordance with the length of the electric wires A and the size of an operator.

Under this condition, the non-slip member 18 provided on the pushing member 16 engages the electric wires A hanging down from one side of the body 6. Thus, the electric wires A are bent inwardly and friction between the electric wires A and the non-slip member 18 occurs. Accordingly, even if the weight of the electric wires A hanging down from the opposite sides of the body 6 is unbalanced, the electric wires A are prevented from falling off the body 6 by the friction.

When the nut 21 is loosened, the pushing member 16 can be vertically moved to any position with respect to the body 6 and can be inclined at any angle with respect to the body 6. Thus, when the electric wires A are relatively thick, the pushing member 16 is moved downwardly so as to be positioned apart from the body 6 and is slightly inclined from the vertical position. Thus, the electric wires A are prevented from being excessively bent. On the other hand, when the electric wires are relatively thin, the pushing member 16 is moved upwardly so as to be positioned close to the body 6 and is pivoted to a generally horizontal position. Thus, adequate friction can be obtained between the electric wires A and the non-slip member 18. Because of these adjustments, burdens on the electric wires A can be reduced and the electric wires A are prevented from falling off the body 6. At this time, the ball 22 is used as a knob.

After the head 2 is set up as described above, a required electric wire A is pulled out one by one (as described below) along the flange 7 and is inserted into a connector. Then, the connecter is mounted in the continuity tester 60 to check the continuity.

With the work bench described above, the electric wires A hung on the body 6 contact each other only at a small portion along the top surface of the body 6. In addition, the electric wire A is pulled obliquely downwardly, instead of being pulled out in the longitudinal direction of the electric wire A. In more detail, as shown in FIG. 4, the operator picks up one end of the electric wire A having a terminal t and pulls forwardly. Then, the electric wire comes outside of the flange 7. When the user continues to pull the electric wire obliquely downwardly, i.e. in the direction F in FIG. 4, the electric wire proceeds along the flange 7 to the top and escapes from the body 6 at the step 7C. Accordingly, there is neither contact among electric wires A throughout the longitudinal direction of the electric wires A nor interference among terminals t. Thus, electric wires A other than the one being pulled out do not come together with the electric wire being pulled. Accordingly, even if the electric wires A are twisted lines or include spliced lines, a required line can be pulled out smoothly.

Further, if the electric wires A become entangled with the electric wire being pulled out and tend to escape from the body 6, the resilient strip 12 presses against the wires A to prevent them from escaping. When the resilient strip 12 fails to keep pressing the electric wires A, the cover board 14 flips the electric wires A and returns them to the body 6. A heavy weight 15 is used when the electric wires A are thick, while a light weight 15 is used when the electric wires A are thin.

Furthermore, the dividing sheet 23 prevents interference between the electric wires A hung on a body of one head and other electric wires A hung on another body.

Thus, with the work bench of the present embodiment, regardless of the type and the length of the electric wires A, the electric wires A can be stored in a compact way and can be pulled out one by one smoothly.

As described above, with the work bench of the present invention, electric wires can be stored in a compact way, regardless of the type and the length of the electric wires to be temporarily bound. Accordingly, space in a factory can be used efficiently. Further, since the electric wires can be pulled out one by one smoothly, the work efficiency is improved. In addition, the electric wires are not damaged by the interference of the terminals. Accordingly, high quality products can be manufactured.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present disclosure relates to subject matter contained in priority Japanese Application No. HEI 11-169705, filed on Jun. 16, 1999, which is herein expressly incorporated by reference in its entirety.

What is claimed is:

1. A work bench for holding electric wires, comprising:
    a generally vertical pillar having a top and a bottom;
    a head provided on the top of said pillar, said head comprising:
        a body having an upper surface on which electric wires may be hung;
        a stopper provided at a first end of said body to prevent the electric wires from falling from said first end of said body and to enable the electric wires to be pulled from said body along said stopper; and
        a swingable member provided on said body so that at least a portion of the electric wire is held between said body and said swingable member.

2. The work bench according to claim 1, wherein said swingable member is pivotably mounted at a second end of said body and extends toward the first end of said body so as to engage at least the portion of each electric wire hung on said body, the second end being opposite to the first end.

3. The work bench according to claim 1, further comprising:
    a pushing member that is provided under said body and pushes inwardly each electric wire hanging down from said body.

4. The work bench according to claim 2, wherein said swingable member comprises:
    a board that is fixed to the second end of said body and extends toward the first end of said body; and
    a resilient strip fixed on a lower surface of said board;
    wherein said resilient strip is configured to engage the wires at a location adjacent to said stopper.

5. The workbench according to claim 4, wherein said board comprises:

a pivoting board that is fixed to the second end of said body by a first hinge and extends toward the first end of said body; and a cover board fixed to said pivoting board at a first end of said cover board by a second hinge and extending toward the first end of said body, a second end of said cover board abutting said stopper, wherein said resilient strip is fixed on a lower surface of said pivoting board, projecting past an end of said pivoting board toward the first end of said body, so that said resilient strip is configured to engage the wires at a location adjacent to said stopper.

6. The work bench according to claim 5, further comprising a weight provided on the second end of said cover board.

7. The work bench according to claim 1, wherein said body has a semi-cylindrical portion, and a curved peripheral surface of the cylindrical portion is directed upwardly.

8. The work bench according to claim 3, wherein said pushing member comprises:

a base board; and a non-slip member fixed to a surface of said base board so that said non-slip member contacts each electric wire hanging down from said body.

9. The work bench according to claim 3, wherein said body has a semi-cylindrical portion, and said pushing member is mounted to be vertically movable and rotatable around one edge of said pushing member, the edge being parallel to a central axis of the semi-cylindrical portion of said body.

10. The work bench according to claim 9, further comprising:

a rear board attached to a second end of said body and extending in a plane that is substantially perpendicular to the central axis of the semi-cylindrical portion and at least toward a lower side of said body, said rear board having a vertically elongated opening;

a shaft attached along said one edge of said pushing member, one end of the shaft being rotatably inserted into said elongated opening and being vertically movable within said elongated opening.

11. The work bench according to claim 7, wherein said stopper projects outwardly past the curved peripheral surface of the semi-cylindrical portion, the amount of the projection becoming larger from one end of the curved peripheral surface to the top of said curved peripheral surface, the amount of projection being reduced at the top and becoming larger from the top, after the reduction, to another end of said curved peripheral surface.

12. The work bench according to claim 3, wherein said body has a semi-cylindrical portion and a curved peripheral surface of the semicylindrical portion is directed upwardly, and said pushing member is provided at a first side of said curved peripheral surface, said work bench further comprising a dividing sheet that hangs down vertically from said head at a second side of the curved peripheral surface, the second side is opposite to the first side with respect to a vertical plane containing a central axis of the semi-cylindrical portion.

13. The work bench according to claim 1, further comprising a bracket that is vertically pivotably fixed to said pillar, said head being fixed to the bracket so that an angle of said head can be adjustable.

14. A system for producing a wire harness subassembly, comprising:

a frame;

a plurality of generally vertical pillars mounted on said frame;

a plurality of heads, each configured to hang electric wires, and each of said plurality of heads provided on a respective one of said plurality of pillars; and a table provided adjacent to said frame and configured to produce a wire harness subassembly by withdrawing the electric wires from said heads and assembling the withdrawn electric wires thereon.

15. The system according to claim 14, further comprising a continuity tester provided on said table, wherein said continuity tester is configured to test continuity of said wire harness subassembly.

16. The system according to claim 14, wherein said frame has a generally U-shape, and said frame is mounted on casters, and the table is provided inside the U-shape of said frame.

17. The system according to claim 14, wherein each of said pillars is extensible and rotatable with respect to a vertical axis of said pillar so that a height and horizontal orientation of said head can be adjustable.

18. The system according to claim 14, wherein said head comprises:

a body configured to hang electric wires, said body having a semi-cylindrical portion, and a curved peripheral surface of the cylindrical portion being directed upwardly;

a stopper provided at a first end of said body to prevent the electric wires from falling from said first end of said body and to enable the electric wires to be pulled from said body along said stopper; and a swingable member provided on said body so that at least a portion of each electric wire is held between said body and said swingable member.

19. The system according to claim 18, wherein said swingable member is pivotably mounted at a second end of said body and extends toward the first end of said body so as to engage at least the portion of each electric wire hung on said body, the second end being opposite to the first end.

20. The system according to claim 14, further comprising:

a pushing member that is provided under said body and pushes inwardly on each electric wire hanging down from said body.

21. The system according to claim 19, wherein said swingable member comprises:

a pivoting board that is fixed to the second end of said body by a first hinge and extends toward the first end of said body;

a resilient strip fixed on a lower surface of said pivoting board, said resilient strip projecting past an end of said pivoting board toward the first end of the body; and a cover board fixed to said pivoting board at a first end of said cover board by a second hinge and extending toward the first end of said body, a second end of said cover board abutting said stopper.

22. The system according to claim 21, further comprising a weight provided on the second end of said cover board.

23. The system according to claim 20, wherein said pushing member comprises:

a base board; and a non-slip member fixed to a surface of said base board so that said non-slip member contacts the one end of each electric wire hanging down from said body.

24. The system according to claim 20, wherein said pushing member is mounted to be vertically movable and rotatable around one edge of said pushing member, the edge being parallel to a central axis of the semi-cylindrical portion of said body.

25. The system according to claim 24, further comprising:
a rear board attached to the second end of said body and extending in a plane that is substantially perpendicular to the central axis of the semi-cylindrical portion and at least toward a lower side of said body, said rear board having a vertically elongated opening;
a shaft attached along said one edge of said pushing member, one end of the shaft being rotatably inserted into said elongated opening and being vertically movable within said elongated opening.

26. The system according to claim 18, wherein said stopper projects outwardly past the curved peripheral surface of the semi-cylindrical portion, the amount of the projection becoming larger from one end of the curved peripheral surface to the top of said curved peripheral surface, the amount of projection being reduced at the top and becoming larger from the top, after the reduction, to another end of said curved peripheral surface.

27. The system according to claim 14, further comprising a dividing sheet between said heads.

* * * * *